(12) United States Patent  
Chen

(10) Patent No.: US 9,147,672 B1  
(45) Date of Patent: Sep. 29, 2015

(54) THREE-DIMENSIONAL MULTIPLE CHIP PACKAGES INCLUDING MULTIPLE CHIP STACKS

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/273,171

(22) Filed: May 8, 2014

(51) Int. Cl.
| | |
|---|---|
| *H01L 23/48* | (2006.01) |
| *H01L 25/18* | (2006.01) |
| *H01L 25/00* | (2006.01) |
| *H01L 25/065* | (2006.01) |
| *H01L 23/538* | (2006.01) |
| *H01L 23/00* | (2006.01) |
| *H01L 21/768* | (2006.01) |

(52) U.S. Cl.
CPC ............. *H01L 25/18* (2013.01); *H01L 21/768* (2013.01); *H01L 23/5389* (2013.01); *H01L 24/17* (2013.01); *H01L 24/81* (2013.01); *H01L 25/0652* (2013.01); *H01L 25/0657* (2013.01); *H01L 25/50* (2013.01); *H01L 2225/06513* (2013.01); *H01L 2225/06541* (2013.01); *H01L 2225/06555* (2013.01); *H01L 2924/143* (2013.01); *H01L 2924/1431* (2013.01); *H01L 2924/1436* (2013.01); *H01L 2924/1437* (2013.01); *H01L 2924/1443* (2013.01)

(58) Field of Classification Search
CPC ............ H01L 23/5384; H01L 23/5385; H01L 23/5386; H01L 23/5389; H01L 21/76805; H01L 21/76816; H01L 25/18; H01L 25/50
USPC .......... 257/774, 698, 777, 778; 438/109, 629, 438/637
See application file for complete search history.

(56) References Cited

U.S. PATENT DOCUMENTS

| | | | |
|---|---|---|---|
| 2005/0169033 A1* | 8/2005 | Sugita et al. .................... 365/63 |
| 2012/0206889 A1* | 8/2012 | Norman ....................... 361/761 |
| 2012/0273933 A1* | 11/2012 | Oganesian et al. ........... 257/700 |
| 2014/0061947 A1 | 3/2014 | Chen | |

* cited by examiner

*Primary Examiner* — Tu-Tu Ho
(74) *Attorney, Agent, or Firm* — Haynes Beffel & Wolfeld LLP

(57) ABSTRACT

A structure of a multichip package and a method for fabricating the multichip package are described. The multichip package includes multiple chip stacks including chips in multiple chip layers. Each of the chip stacks includes two or more chips, each chip being inside vertical projection of at least another chip in the chip stack and disposed in a respective chip layer. Each of the chip stacks also includes horizontal conductive lines extending to perimeter regions around the chip stacks, the chips in a particular chip layer being electrically connected to horizontal conductive lines disposed in the particular chip layer. Each of the chip stacks also includes vertical conductive lines in the perimeter regions electrically connected to one or more of the horizontal conductive lines in at least two chip layers. The multichip package also includes a controller chip electrically connected to at least one chip in the chip stacks.

20 Claims, 10 Drawing Sheets

_US 9,147,672 B1_

THREE-DIMENSIONAL MULTIPLE CHIP PACKAGES INCLUDING MULTIPLE CHIP STACKS

TECHNICAL FIELD

This disclosure relates to three-dimensional multichip packages.

DESCRIPTION OF RELATED ART

In three-dimensional multichip chip packages, multiple chips (dies) can be stacked vertically and interconnected to form a single device. The stacked chips can be interconnected with electrical connections such as bonding wires around the edges of the stacked chip. A three-dimensional multichip package can achieve higher storage capacity and/or functionality in a small form factor.

A through-silicon via (TSV) is a vertical electrical connection passing through a silicon chip. In comparison, bonding wires, through-silicon vias provide shorter electrical connections between stacked chips. The shorter signal travelling time along with lower resistance and parasitic capacitance of the shorter connections can enable a wider connection bus and a higher connection speed, as well as lower power consumption.

Through-silicon vias have many manufacturing challenges. It can be challenging to open through-silicon holes and fill the holes with conducting materials such as copper. It can also be challenging to align through-silicon via connections between two chips made by different manufacturers (with different design rules). Through-silicon vias may introduce stress that changes circuit characteristics of nearby devices. Through-silicon vias also generally require more relaxed design rules, thus may increase silicon area and cost.

Three-dimensional multiple chip packages can be formed by using through-dielectric vias (TDVs). For example, U.S. patent application Ser. No. 13/597,669 filed on 29 Aug. 2012, entitled Chip Stack Structure and Manufacturing Method Thereof, describes a stacked chip structure using through-dielectric vias. The stacked chip structure has two or more stacked chips mounted on different substrates and has dielectric layers between the substrates. The stacked chips are interconnected by using horizontal conductors disposed in the substrates, and vertical conductors that pass through the substrate or dielectric layers at locations outside the edges of the stacked chips. Through-dielectric vias can provide more dense connections between stacked chips than wire bonding. However, similar to wire bonding, connection distances between the stacked chips are generally determined by sizes of the stacked chips, thus the connection speed and bandwidth between the stacked chips can be limited by the sizes of the stacked chips.

One challenge in manufacturing a multichip package is that the manufacturing yield of the multichip package can be lower than the manufacturing yield of individual components in the multichip package. Furthermore, a defective component (e.g., a defective chip) in a multichip package can render the entire package non-functioning.

It is therefore desirable to provide a three-dimensional multichip package with through-dielectric vias that has higher connection speed and bandwidth between interconnected chips in the three-dimensional multichip package. It is also desirable to provide a three-dimensional multichip package that has built-in redundancy.

SUMMARY

The present technology provides a multichip package and a method for fabricating the multichip package. The multichip package can include an array of chip stacks, in which the chip stacks are separated by an insulator in perimeter regions surrounding each chip stack in the array. Vertical connections among the chips in the chip stacks are made using interlayer connections through the perimeter regions. Horizontal connections from the chips to the interlayer connections can be made using lines in the chip layers of the stack. A controller chip configured to control utilization of the chips in the array of chip stacks can be included in the multichip package.

A multichip package is described that includes a plurality of chip stacks including chips in a plurality of chip layers. Each of the chip stacks includes two or more chips, each chip being inside vertical projection of at least another chip in the chip stack and disposed in a respective one of the chip layers. Each of the chip stacks also includes horizontal conductive lines extending to perimeter regions around the chip stacks, the chips in a particular chip layer being electrically connected to horizontal conductive lines disposed in the particular chip layer. Each of the chip stacks also includes vertical conductive lines in the perimeter regions electrically connected to one or more of the horizontal conductive lines in at least two chip layers.

The multichip package also includes a controller chip electrically connected to at least one chip in the chip stacks.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1A:
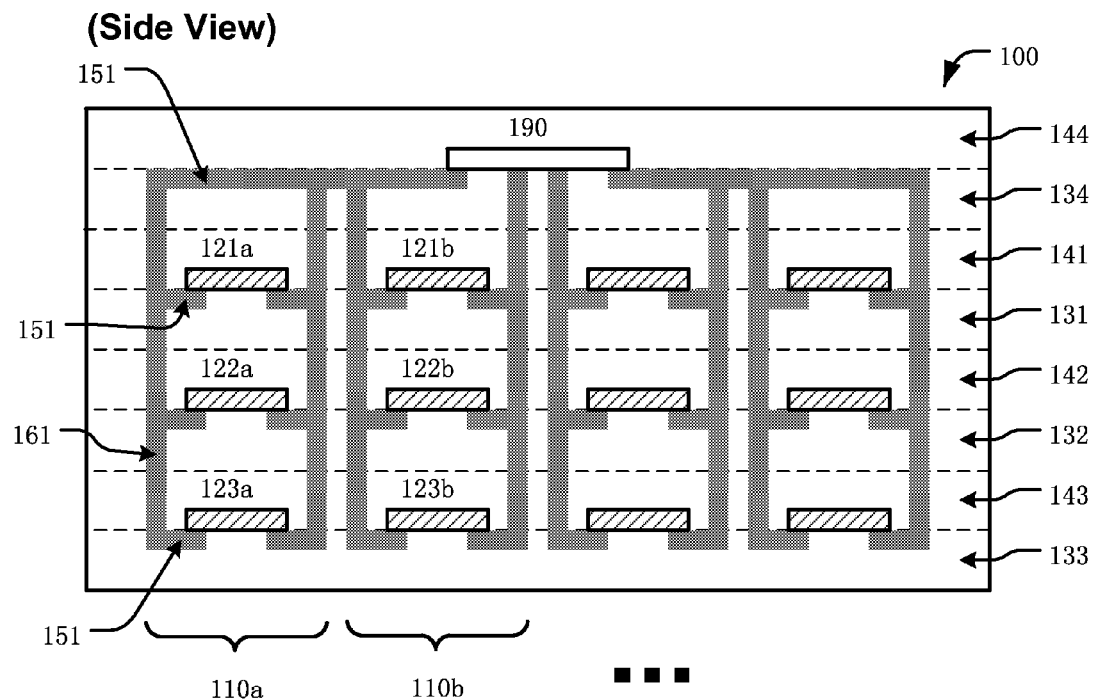
FIG. 1A illustrates a side view and FIG. 1B illustrates a top view of a three-dimensional multichip package with multiple chip stacks.
Figure 1B:
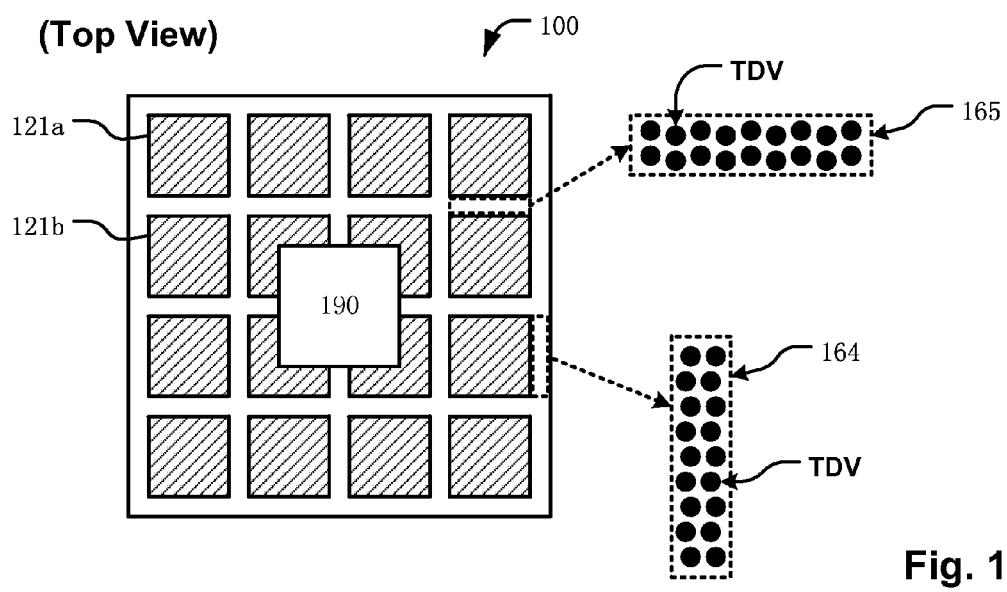

FIG. 1A illustrates a side view and FIG. 1B illustrates a top view of a three-dimensional multichip package 100 with multiple chip stacks. The three-dimensional multichip package 100 includes a plurality of chip stacks 110*a*, 110*b*, and so on.

Each chip stack (e.g., 110a) includes two or more chips (e.g., chips 121a, 122a, and 123a) stacked in the vertical direction. That is, each chip of a particular chip stack is inside vertical projection of at least another chip in the particular chip stack.

Chips in a chip stack of the three-dimensional multichip package 100 may have the same or different sizes. Chips in a chip stack of the three-dimensional multichip package 100 may be of the same or different types of chips. The chip stacks (110a, 110b . . . ) can have the same combination of chips in some examples. For example, the first-level (top-level) chips (121a, 121b . . . ) can be logic chips (e.g., one or more processor cores with a bus interface unit and a memory access unit), while the second-level chips (122a, 122b . . . ) can be a first type of memory chip (e.g., a dynamic random-access-memory such as a DRAM chip). The third-level chips (123a, 123b . . . ) can be a second type of memory chip (e.g., a non-volatile memory chip such as a flash memory chip or a phase change memory chip). For another example, the first-level chips are logic chips, while the second-level and third-level chips are first and second level cache memories for the logic chip (e.g., the second-level and third-level chips can be of the same or different types of memory with the same or different speed). For yet another example, the first-level chips are logic chips. The second-level and third-level chips can be memories for the logic chips. The second-level chips can include peripheral circuits (e.g., I/O circuits, error-correcting code or ECC circuits) of the memories. The third-level chips can include memory cell arrays of the memories. In another example, all of the chips in all of the stacks can be the same type of memory chip, with the controller chip configured as a memory controller to manage access to the memory chips.

In some embodiments, multiple instances of the same type of chip stack (e.g., including a logic chip, a first memory chip, and a second memory chip) can be provided in the three-dimensional multichip package 100. The multiple instances of the same chip stack can be configured to provide higher interconnection bandwidth and redundancy, as will be explained later with FIGS. 5-12.

Chips in the chip stacks of the three-dimensional multichip package 100 are disposed in a plurality of chip layers. Each chip layer includes chips and conductive lines connecting the chips, and one or more insulator layers supporting the chips and conductive lines in the chip layer. For example, the first-level (top-level) chip layer includes the insulator layer 131 and the first-level chips (121a, 121b . . . ) disposed on the insulator layer 131. The second-level chip layer includes the insulator 132 and the second-level chips (122a, 122b . . . ) disposed on the insulator layer 132. The third-level (bottom-level) chip layer includes the insulator layer 133 and the third-level chips (123a, 123b . . . ) disposed on the insulator layer 133. Each chip layer can also include an insulator layer (e.g., 141, 142, or 143) covering the chips in the chip layer and supporting the chip layer above.

The insulator layers 131, 132, 133, 142, and 143 may comprise silicon dioxide, a polymer or other insulating materials suitable for supporting the conductive lines and chips as described herein. Also, the insulator layers can include multiple types of materials.

The bottom insulator layer 133 can be disposed atop a substrate layer. For example, the bottom insulator layer can be a silicon dioxide layer grown at the surface of a silicon wafer. For another example, the bottom insulator layer can be an insulator layer held by a printed circuit board (PCB) or a ceramic substrate.

Chips in a chip layer are electrically connected to horizontal conductive lines in the chip layer. For example, first-level chips (121a, 121b . . . ) in the first-level chip layer are electrically connected to horizontal conductive lines 151 disposed in the insulator layer 131. The second-level chips (122a, 122b . . . ) in the second-level chip layer are electrically connected to horizontal conductive lines 151 disposed in the insulator layer 132. The third-level chips (123a, 123b . . . ) in the third-level chip layer are electrically connected to horizontal conductive lines 151 disposed in the insulator layer 133. Horizontal conductive lines 151 in two different chip layers can be connected by vertical conductive lines 161 (through-dielectric vias) that pass through insulator layers between the horizontal conductive lines 151. For example, horizontal conductive lines in the second level chip layer (disposed in the insulator layer 132) and horizontal conductive lines in the third-level chip layer (disposed in the insulator layer 133) can be connected by vertical conductive lines passing through the insulator layers 132 and 143. Thus chips in each of the chip stacks (e.g., 110a) can be electrically interconnected by using horizontal conductive lines 151 and vertical conductive lines 161.

In FIG. 1A, only one level of horizontal conductive lines 151 is shown for each chip layer. For more complex routing, a chip layer can have more than one level of horizontal conductive lines connecting the chips in the three-dimensional multichip package 100. For example, the third-level chip layer (including the third-level chips 123a, 123b . . . ) can have another level of horizontal conductive lines disposed in the insulator layer 143.

Each vertical conductive line 161 in a chip stack is in a perimeter region outside vertical projection of at least one chip in the chip stack and is outside vertical projection of chips of another chip stack in the three-dimensional multichip package 100. That is, vertical conductive lines (through-dielectric vias) of a particular chip stack are disposed in perimeter regions around chips in the particular chip stack and areas between the particular chip stack and other adjacent chip stacks in the three-dimensional multichip package 100, as illustrated by the magnified views 164 and 165 in FIG. 1B.

Each horizontal conductive line 151 of a chip stack is outside vertical projection of chips in another chip stack in the three-dimensional multichip package 100. That is, horizontal conductive lines of a chip stack are disposed within perimeter regions around chips and electrically connected to chips in the chip stack.

The three-dimensional multichip package 100 also includes a controller chip 190 disposed above the chips in the top-level chip layer. As illustrated in FIG. 1A, the controller chip 190 is disposed on insulator layer 134. The insulator layer 134 is disposed over the insulator layer 141 covering the insulator layer 131 and chips in the top-level chip layer (chips 121a, 121b . . . ). An additional insulator layer 144 may cover the controller chip 190 and the insulator layer 134. The controller chip 190 is configured to provide control signals for controlling operation or configuration of the chips in the multichip package. The controller chip 190 in this example includes, or is part of, a controller electrically connected to at least one chip in the plurality of chip stacks, and in some embodiments to at least one chip in each of the chip stacks, via at least one of the vertical conductive lines 161 in a through-dielectric via in one of the perimeter regions. For example, the controller chip 190 can be connected via horizontal conductive lines 151 in the insulator layer 134 and vertical conductive lines 161 (through-dielectric vias) that pass through the insulator layers 134 and 141. The controller chip 190 includes circuits (e.g., a control function unit or other control logic, a bus interfacing unit) that are configured to control activities of the chips stacks in the three-dimensional multichip package 100 (e.g., by sending control signals to one or more of the chip stacks). In one embodiment, the controller chip 190 is not part of the three-dimensional multichip package 100 (i.e., an "off-package" controller). The controller can interface with the chip stacks in the three-dimensional multichip package 100 via conductive wires and/or other circuits (e.g., I/O circuits of the three-dimensional multichip package 100, or a bridge chip).

Figure 2A:
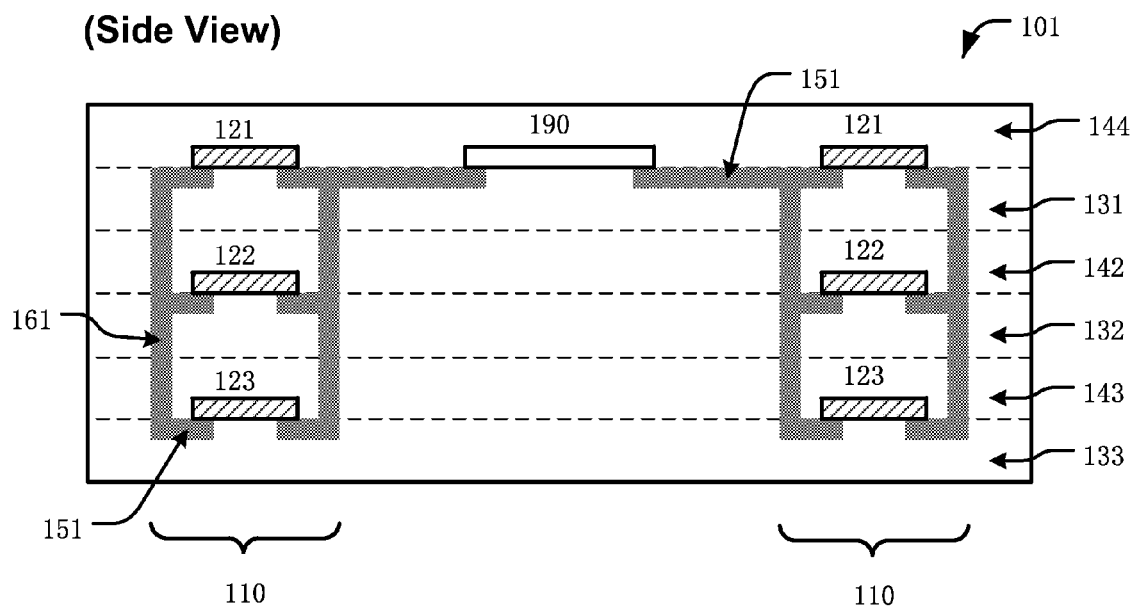
FIG. 2A illustrates a side view and FIG. 2B illustrates a top view of another embodiment of a three-dimensional multichip package with multiple chip stacks.
Figure 2B:
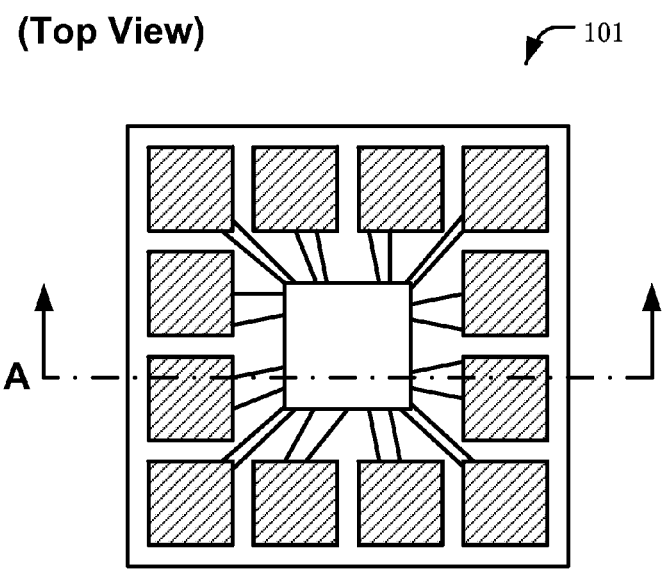

FIG. 2A illustrates a side view and FIG. 2B illustrates a top view of another embodiment of a three-dimensional multichip package (101) with multiple chip stacks. The side view is at the cross section A-A' indicated in the top view. Similar to the three-dimensional multichip package 100 illustrated in FIGS. 1A and 1B, the three-dimensional multichip package 101 has multiple (12) chip stacks 110 with chips disposed in three chip layers. The first-level (top-level) chip layer includes insulator layer 131 and first-level (top-level) chips 121 disposed on the insulator layer 131. The second-level chip layer includes the insulator layers 132 and 142, and second-level chips 122 disposed on the insulator layer 132. The third-level chip layer includes insulator layers 133 and 143, and third-level chips 123 disposed on the insulator layer 133. Chips within a chip stack 110 are connected via vertical conductive lines 161 and horizontal conductive lines 151. The controller chip 190 is disposed on the same insulator layer 131 as other top-level chips 121 are. That is, the controller chip 190 is disposed in the top-level chip layer of the three-dimensional multichip package 101. In comparison, the controller chip 190 is disposed above the top-level chips (121a, 121b . . . ) in the top-level chip layer of the three-dimensional multichip package 100 illustrated in FIG. 1A.

In FIGS. 2A and 2B, the controller chip 190 is electrically connected to at least one chip in the chip stacks 110 via horizontal conductive lines 151 in the insulator layer 131. The controller chip 190 includes circuits that are configured to control activities of the chip stacks 110 in the three-dimensional multichip package 101. The three-dimensional multichip package 101 can also include insulator layer 144 covering the controller chip 190, first-level chips 121, and the insulator layer 131.

Note that the side views of FIGS. 1A and 2A show a simplified view of horizontal conductive lines 151 and vertical conductive lines 161 connecting chips within each chip stack and connecting the controller chip 190 and the chip stacks. Each segment of the horizontal or vertical conductive lines shown in FIGS. 1A and 2A may comprise multiple segments of conductive lines of different lengths or sizes, as discussed below with FIG. 3.

Figure 3:
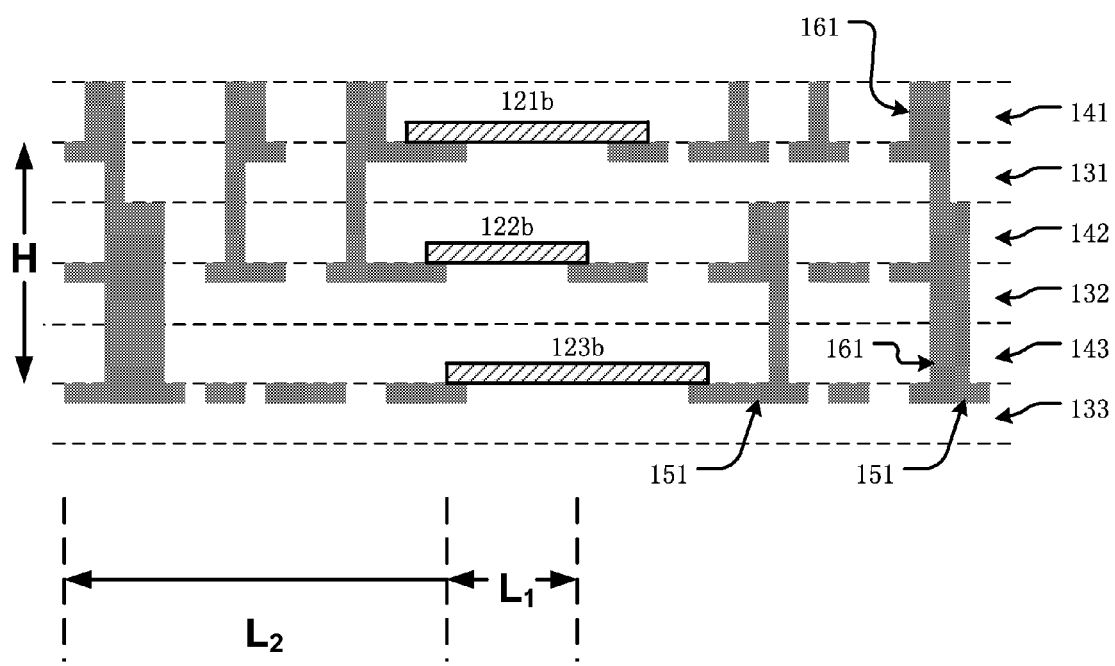
FIG. 3 is a more detailed side-view illustration of one of the chip stacks in the three-dimensional multichip package shown in FIG. 1A.

FIG. 3 is a more detailed side-view illustration of the chip stack 110b shown in FIG. 1A. As described with FIG. 1A, the chip stack 110b includes the third-level chip 123b disposed on the insulator layer 133, the second-level chip 122b disposed on the insulator layer 132, and the first-level chip 121b disposed on the insulator layer 131. The chips 121b, 122b, and 123b are interconnected via horizontal conductive lines 151 disposed in respective insulator layers, and vertical conductive lines 161 comprising through-dielectric vias passing through the insulator layers 131, 132, 142, and 143. The through-dielectric vias may have different sizes (diameters).

Figure 4A:
FIGS. 4A-4H illustrate steps for fabricating the bottom two levels of the chip stack illustrated in FIG. 3.
Figure 4B:
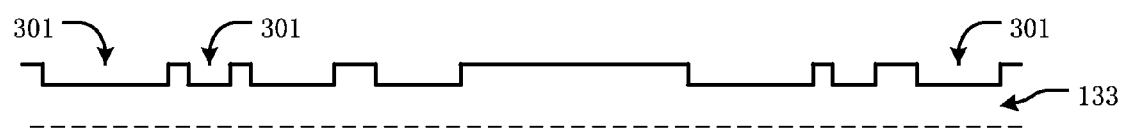
Figure 4C:
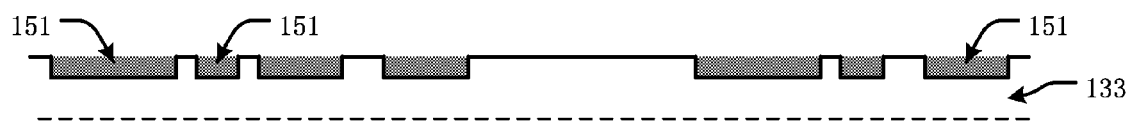

FIGS. 4A-4H illustrate steps for fabricating the bottom two levels of the chip stack 110b illustrated in FIG. 3. The manufacturing steps start with the insulator layer 133 shown in FIG. 4A. Horizontal conductive lines 151 are formed in the insulator layer 133 using a damascene process, as illustrated in FIGS. 4B-4C. In FIG. 4B, the insulator layer 133 is patterned (e.g., using photo resist) and etched to create multiple trenches 301.

Next, a conductive material such as copper or aluminum is filled into the trenches 301 to form horizontal conductive lines 151, as illustrated in FIG. 4C. A planarization method such as chemical mechanical polishing (CMP) can be used to flatten the top surface of the structure shown in FIG. 4C after the horizontal conductive lines 151 are formed. Other methods can be used for forming horizontal conductive lines 151. For example, a blanket metal layer (e.g., an aluminum layer) can be first formed on top of the insulator layer 133. The metal layer is then patterned and etched (e.g., using photo resist and plasma etching) to form horizontal conductive lines 151.

Figure 4D:
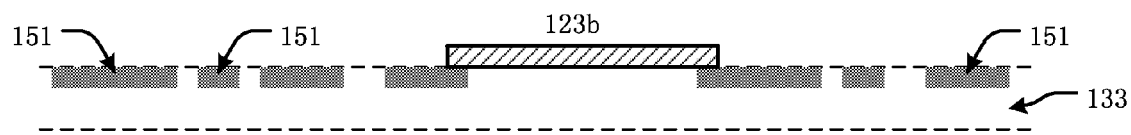

The chip 123b (the third-level chip of the chip stack 110b) can be flip mounted onto the insulator layer 133, as illustrated in FIG. 4D. The chip 123b is electrically connected (e.g., via controlled collapse chip connection or C4 bumps) to at least some of the horizontal conductive lines disposed in the insulator layer 133.

In other embodiments, the chip 123b can be mounted in the insulator layer 133 facing upwards. For example, a trench can be formed in the insulator layer 133 with the trench depth being about the same as the thickness of the chip 123b. The chip 123b is then mounted within the trench, with the chip's connection pads facing upward. Horizontal conductive lines 151 electrically connected to the chip's connection pads then are formed above the chip 123b and in the perimeter regions around the chip 123b.

The chip 123b may be first tested and thinned (reduction in its thickness) before it is mounted in the insulator layer 133.

Figure 4E:
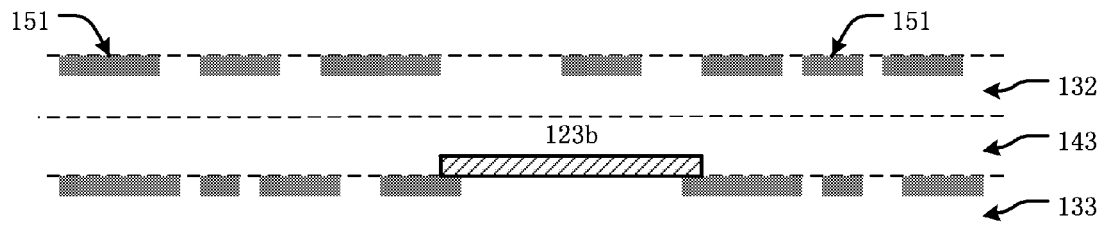

As illustrated in FIG. 4E, after the third-level chip 123b is disposed on the insulator layer 133, the insulator layer 143 is formed, covering the chip 123b, the insulator layer 133, and the horizontal conductive lines 151 formed in the insulator layer 133. The insulator layer 143 may be flattened by using a planarization method such as CMP. Subsequently the insulator layer 132 is formed on top of the insulator layer 143. In one embodiment, the insulator layers 132 and 143 may be a single insulator layer formed on top the chip 123b and the insulator layer 133.

Horizontal conductive lines 151 are formed in the insulator layer 132 using the damascene process as described above for forming the horizontal conductive lines in the insulator layer 133 (FIGS. 4B-4C).

Figure 4F:
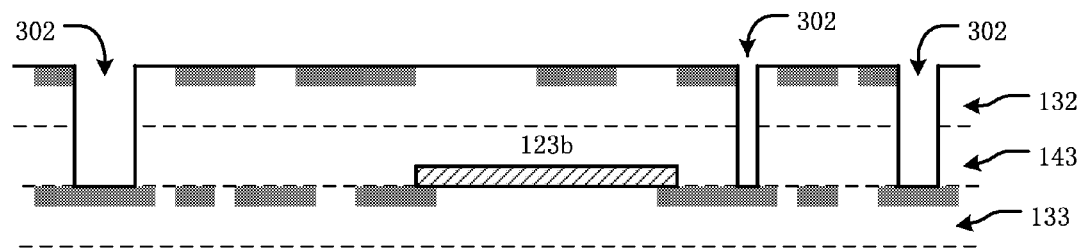
Figure 4G:
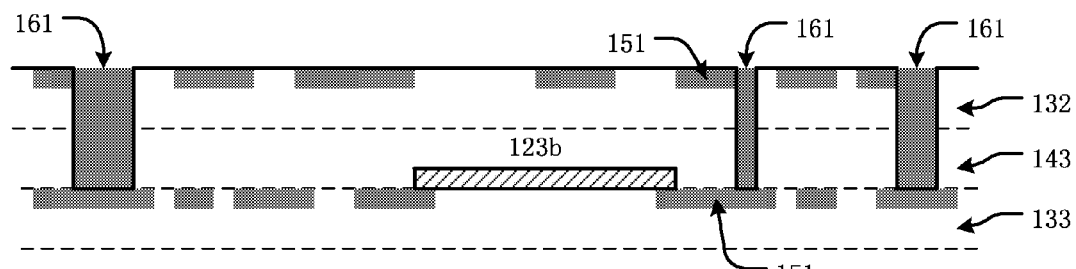

The structure illustrated in FIG. 4E then is patterned (e.g., using photo resist) and etched to create trenches 302, as illustrated in FIG. 4F. As illustrated in FIG. 4G, the trenches 302 are then filled with a conductive material (e.g., copper, or aluminum) to form the vertical conductive lines 161, electrically connecting one or more horizontal conductive lines 151 in the insulator layer 132 with one or more horizontal conductive lines 151 in the insulator layer 133. Note that a vertical conductive line 161 is a through-dielectric via as it passes through the insulator layers 132 and 143 in perimeter regions around the chip 123b. The top surface of the insulator layer 132 may be flattened using a planarization method such as CMP.

Figure 4H:
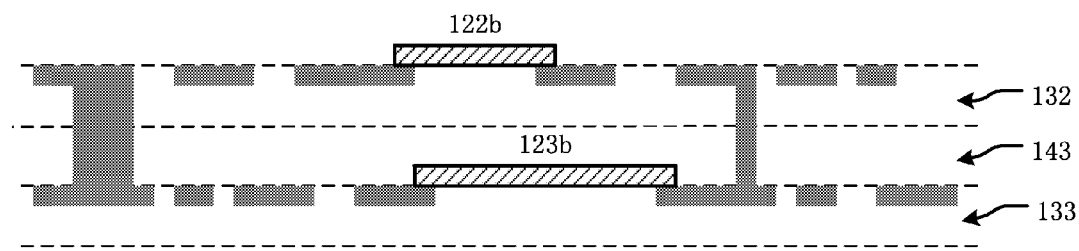

The second-level chip 122b is then mounted on the insulator layer 132, as illustrated in FIG. 4H. The chip 122b is electrically connected to one or more horizontal conductive lines 151 in the insulator layer 132. Thus the chip 122b can be connected to the chip 123b through one or more horizontal conductive lines 151 in the insulator 132, one or more vertical conductive lines 161 (through-dielectric vias) in the perimeter regions around chips 122b and 123b, and one or more horizontal conductive lines 151 in the insulator layer 133.

Although only formation of a portion of the chip stack 110a is shown in FIGS. 4A-4H, the entire three-dimensional multichip package 100 (or multiple instances of the three-dimensional multichip package 100) can be formed based on steps similarly described with FIGS. 4A-4H. For example, starting with the insulator layer 133, horizontal conductive lines can be formed in the insulator layer 133 and multiple third-level chips (123a, 123b . . . ), for multiple instances of the three-dimensional multichip package 100, can be mounted on the insulator layer 133 at respective locations. The process continues with forming the insulator layers 143 and 142, the insulator layers 132 and 131, horizontal conductive lines in the insulator layers and vertical conductive lines (through-dielectric vias) passing through the insulator layers, and mounting second-level chips (122a, 122b . . . ), first-level chips (121a, 121b . . . ), and controller chips 190 at respective locations. After multiple instances of controller chip 190 are mounted at respective locations, insulator layer 144 is formed, covering the controller chips 190. The entire structure then is cut into individual instances of the three-dimensional multichip package 100.

A maximum connection distance between two chips within a chip stack using horizontal and vertical conductive lines described above is a function generally of the sum of the chip size, the width of the perimeter region of the chip stack, and the height of vertical connections in the perimeter region around the chip stack. For example, the maximum connection distance between chips (D) in the chip stack illustrated in FIG. 3 can be the sum of the maximum chip size $2\times L_1$, two times ($2\times$) of the width of the perimeter region of the chip stack $L_2$, and height of vertical connections H between the top and the bottom insulator layers: $D=2\times L_1+2\times L_2+H$. D is an estimate in distance of a longest conductive path that a signal can travel between two chips within the chip stack. The conductive path can include a horizontal conductive line travelling from the middle to the edge of a chip in the top insulator layer ($L_1$), a horizontal conductive line in the top insulator layer travelling the width of the perimeter region from the edge of the chip in the top insulator layer to the edge of the chip stack ($L_2$), a vertical conductive line travelling from the top insulator layer to the bottom insulator layer (H), a horizontal conductive line in the bottom insulator layer travelling the width of the perimeter region from the edge of the chip stack to the edge of a chip in the bottom insulator layer ($L_2$), and a horizontal conductive line travelling from the edge to the middle of the chip in the bottom insulator layer ($L_1$). The chip size ($2\times L_1$) can be between about 1 and 20 millimeters (mm). The thickness of each chip can be as thin as 10 to 25 micrometers (μm) after thinning. The total height of vertical connections (H) of a chip stack can be between about 20 and 500 micrometers (μm), depending on the number of levels in the chip stack. The width of the perimeter region of the chip stack ($L_2$) is about several micrometers (μm) to several millimeters, depending on the chip size and the number of vertical connections (through-dielectric vias) in the perimeter region (e.g., in FIG. 3, if chip 122b is smaller than 123b, then $L_2$ for chip 122b is larger than $L_2$ for chip 123b). A through-dielectric via can have a diameter of about 2 micrometers and a spacing from another through-dielectric via of about 2 micrometers. Note that FIG. 3 is not drawn to scale. As the chip sizes can be much greater than the height of vertical connections and the width of the perimeter region of the chip stack, a large fraction of the maximum connection distance between two chips within a chip stack is determined by sizes of the stacked chips.

In comparison with a longer connection between two chips, a shorter connection between the chips has shorter signal traveling time and lower resistance and parasitic capacitance. The shorter signal traveling time along with the lower resistance and parasitic capacitance can enable a higher connection speed and bandwidth for the shorter connection. As describe above, a large fraction of the maximum connection distance between two chips of a chip stack is determined by sizes of the stacked chip. Interconnection speed and bandwidth of a chip stack thus can be improved by reducing sizes of chips in the chip stack. More particularly, chip sizes of stacked chips in a three-dimensional multichip package can be reduced by having multiple chip stacks in the package, each with smaller chip sizes. The multiple chip stacks can be formed and interconnected with a controller chip as illustrated by the three-dimensional multichip package 100 described above. For example, a three-dimensional multichip package with multiple chip stacks and a controller chip may include 4 to 400 chip stacks (e.g., a two-by-two array of chip stacks, to a twenty-by-twenty array of chip stacks). Each chip in the package can have a size of about 1 to 10 millimeters in width, in length, or in width and length. The optimal number of chip stacks and optimal chip sizes can be determined based on design rules for the horizontal and vertical conductive lines connecting the chips in the chip stacks. The optimal number of chip stacks and optimal chip sizes can also be determined based on the complexity in connecting chips in the chip stacks.

Figure 5:
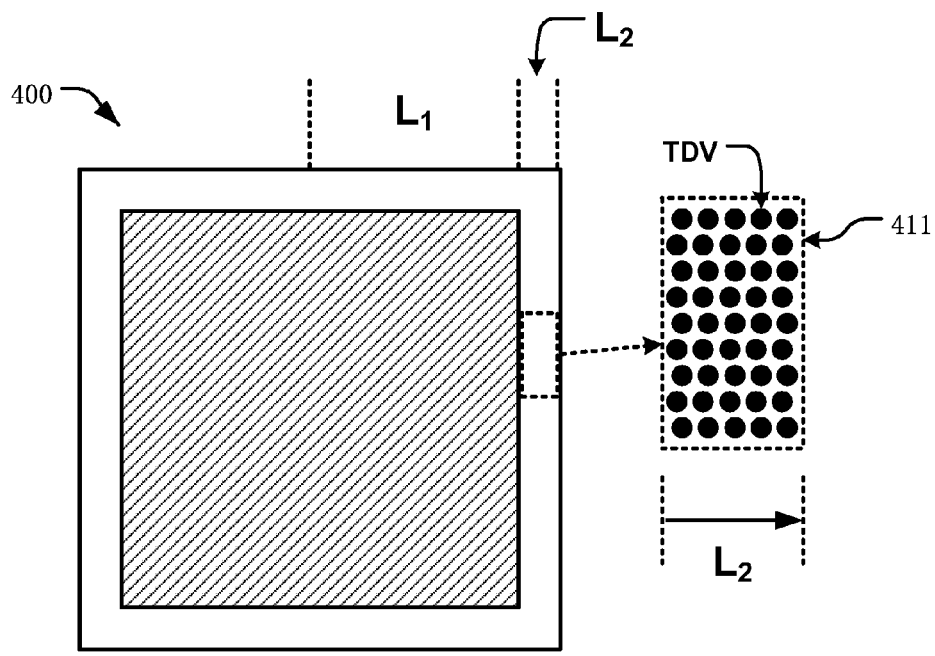
FIG. 5 illustrates a top view of a single chip stack.

For example, a single three-level chip stack 400 illustrated in FIG. 5 may include a chip with 16 processor cores at the first level, a 16 Mb DRAM chip at the second level, and a 16 Mb NAND chip at the third level. The same functionality of the single chip stack 400 can be implemented with 16 identical chip stacks, each chip stack including one processor core at the first level, one 1 Mb DRAM chip at the second level, and one 1 Mb NAND chip at the third level. The 16 instances of the smaller chip stack and a controller chip can form a single three-dimensional multichip package, such as the three-dimensional multichip package 100 illustrated in FIGS. 1A and 1B.

Figure 6:
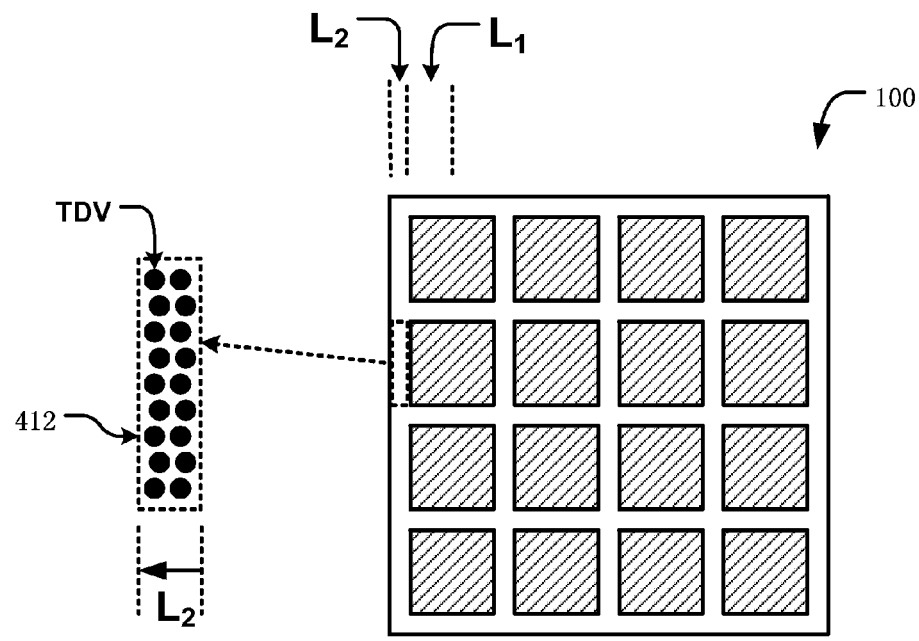
FIG. 6 illustrates a top view of a package with multiple chip stacks.

FIG. 5 illustrates a top view of the single chip stack 400 with a chip having 16 processor cores at the first level, a 16 Mb DRAM chip at the second level, and a 16 Mb NAND chip at the third level. FIG. 6 illustrates a top view of the three-dimensional multichip package 100 including 16 instances of the small chip stack with one processor core at the first level, one 1 Mb DRAM chip at the second level, and one 1 Mb NAND chip at the third level. The controller chip of the three-dimensional multichip package 100 is not shown in FIG. 6 for simplicity. Note that the maximum chip size $2\times L_1$ is generally reduced to $1/\sqrt{16}=\frac{1}{4}$ as the single chip stack is implemented with 16 smaller (and identical) chip stacks. Meanwhile, since the total perimeter length increases by about 10/4=2.5, the number of vertical connections (through-silicon vias) at each edge of the chip stack(s) can be reduced (for a given total number of vertical connections). Thus the width of the perimeter region of the chip stack $L_2$ can also be reduced, as illustrated by the magnified views 411 and 412 in FIGS. 5 and 6. Reduction in the maximum chip size $2\times L_1$ and the width of the perimeter region of the chip stack $L_2$ decrease the maximum connection distance between chips in the smaller chip stack in the three-dimensional multichip package 100. The decreased (shorter) maximum connection distance between chips in the three-dimensional multichip package 100 can improve the connection speed and bandwidth between chips in the smaller chip stack in the three-dimensional multichip package 100 in comparison with the connection speed and bandwidth between chips in the single chip stack 400.

In addition to higher interconnection speed and bandwidth, the three-dimensional multichip package 100 with 16 instances of the small chip stack with one processor core at the first level, one 1 Mb DRAM chip at the second level, and one 1 Mb NAND chip at the third level, has several other differences in comparison with the single chip stack 400 with a 16 processor core chip at the first level, a 16 Mb DRAM chip at the second level, and a 16 Mb NAND chip at the third level. For example, each of the smaller chips in the three-dimensional multichip package 100 can have higher manufacturing yield than a chip in the single chip stack 400.

Figure 7:
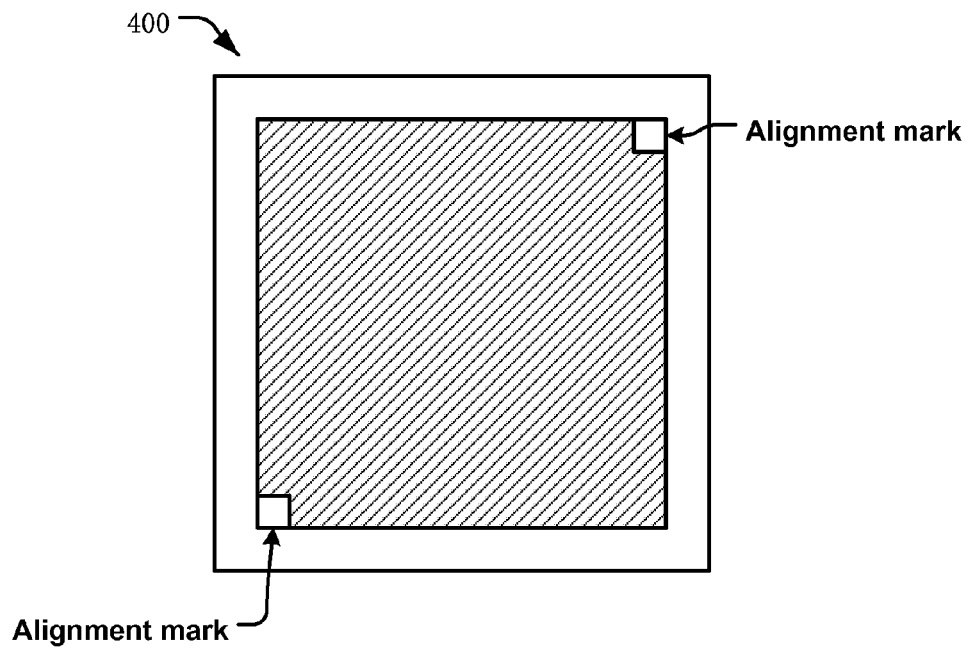
FIG. 7 illustrates alignment marks of the single chip stack illustrated in FIG. 5.
Figure 8:
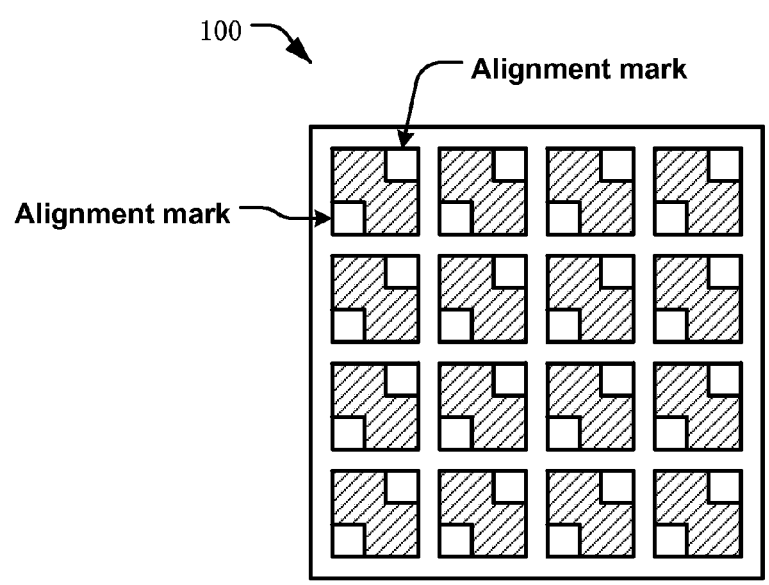
FIG. 8 illustrates alignment marks of the package with multiple chip stacks illustrated in FIG. 6.
Figure 9:
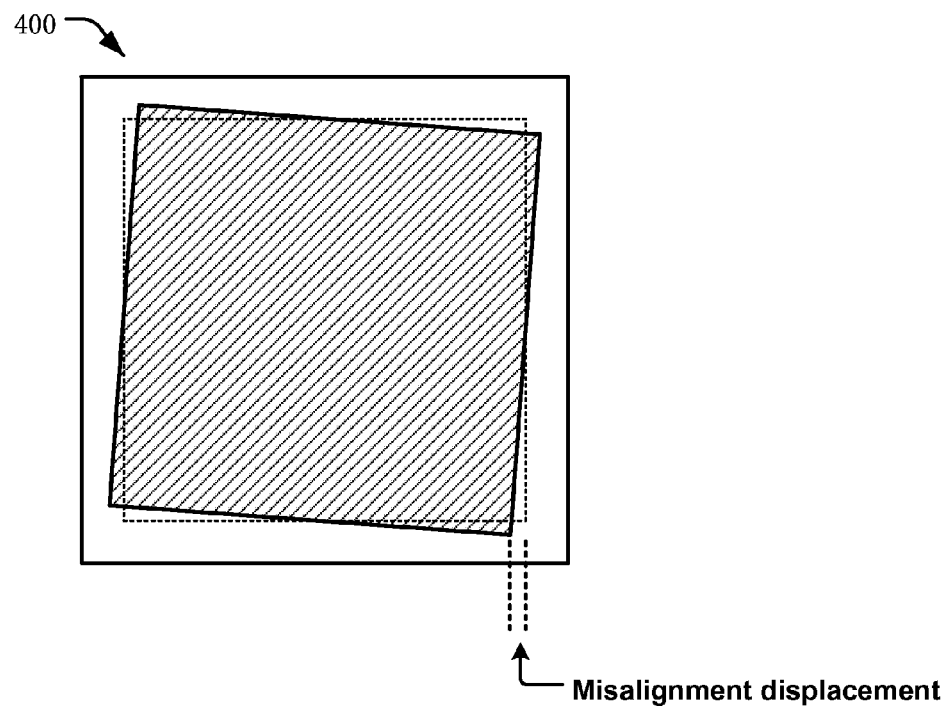
FIG. 9 illustrates alignment displacement of the single chip stack illustrated in FIG. 5.
Figure 10:
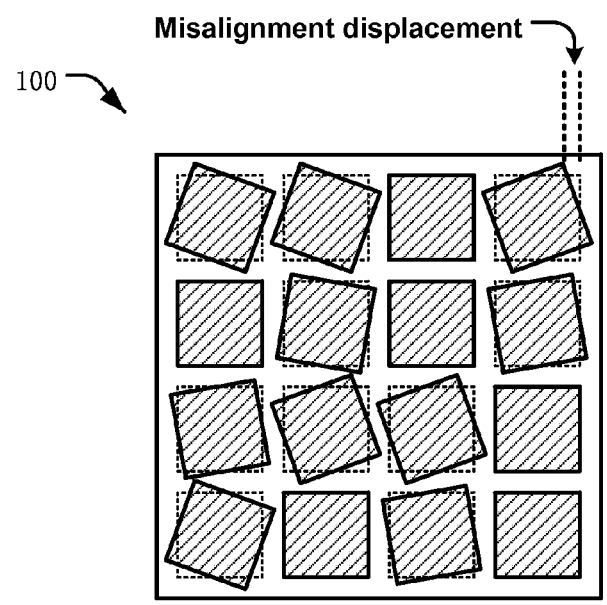
FIG. 10 illustrates alignment displacement of the package with multiple chip stacks illustrated in FIG. 6.

FIG. 7 illustrates a top view of the single chip stack 400 described above. FIG. 8 also illustrates a top view of the three-dimensional multichip package 100 with 16 small chip stacks described above. FIGS. 7 and 8 also show alignment marks at opposite corners of a chip for mounting the chip on an insulator layer. Because of the shorter distance between alignment marks, the smaller chip in the small chip stacks of the three-dimensional multichip package 100 can have larger rotational misalignment than the bigger chips in the single chip stack 400. As displacement distance of a misaligned chip is a product of the chip size and angle of the chip's rotational misalignment, the larger rotational misalignment for the chips in the small chip stacks may not result in larger displacement distance in misalignment because of the smaller chip sizes, as illustrated in FIGS. 9 and 10. However, because each chip of the 16 chip stacks in the three-dimensional multichip package 100 may have different alignment displacements at different directions, alignment tolerance for mounting a larger number of chip stacks may need to be increased.

In comparison with the single chip stack 400, the three-dimensional multichip package 100 may have a higher mounting cost (and take a longer time to mount) as there are more chips to mount. However, it may be difficult to mount a large chip in the single chip stack 400 to a planar surface due to mismatch in curvature between a large chip and the surface on which it is to be mounted. The single chip stack 400 using large chips thus may have reduced manufacturing yield as a result.

In comparison to a single chip stack, a package with multiple chip stacks and a controller chip such as the three-dimensional multichip package 100 of FIGS. 1A and 1B can provide additional redundancy and dynamic control capability. For example, the chip stacks (110a, 110b...) can operate independently from each other. The controller chip 190 (e.g., circuits and logic implemented in the controller chip 190) can dynamically adjust an operating frequency of a particular chip stack (e.g., by sending a control signal to the particular chip stack) based on work load or thermal condition.

Figure 13:
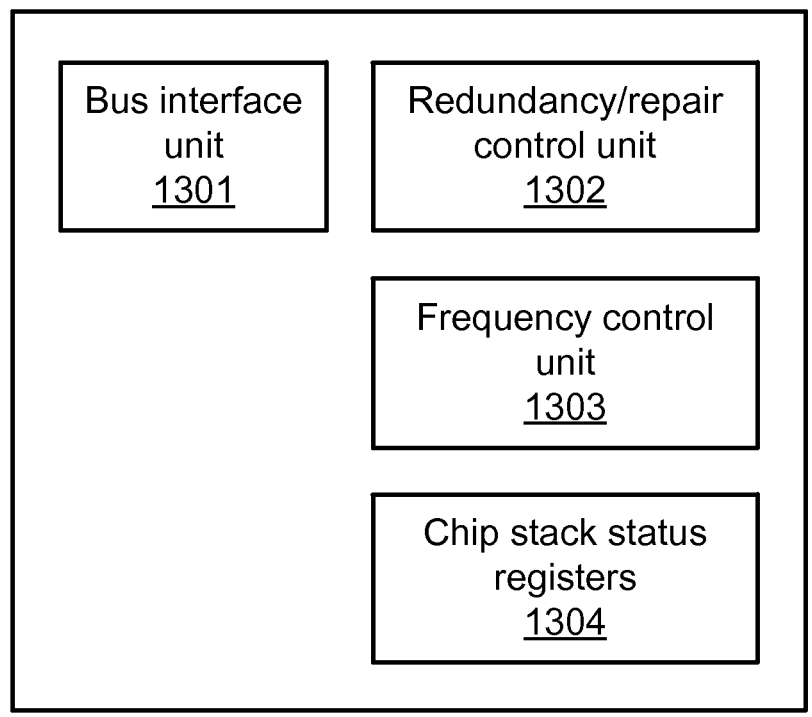
FIG. 13 is an example block diagram of a controller chip.

FIG. 13 is an example block diagram of the controller chip 190. The controller chip 190 includes a bus interface unit 1301 that sends and receives signals from chip stacks in the multichip package. A frequency control unit 1303 in the controller chip 190 can send a frequency control signal (via the bus interface unit) to a particular chip stack in the multichip package to adjust operating frequency of the particular chip stack. The frequency control unit 1303 can also maintain the current operating frequency of the particular chip stack (and other chip stacks in the multichip package) in the chip stack status registers 1304.

Figure 11:
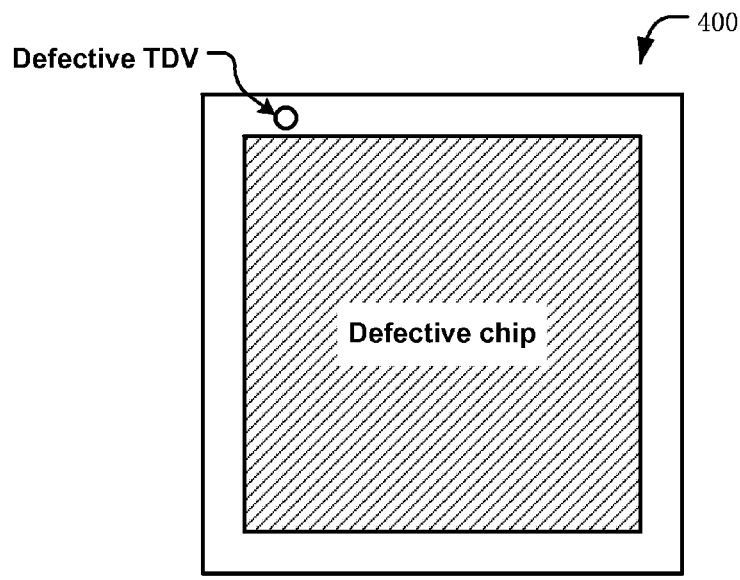
FIG. 11 illustrates a defective through-silicon via and a defective chip in the single chip stack illustrated in FIG. 5.
Figure 12:
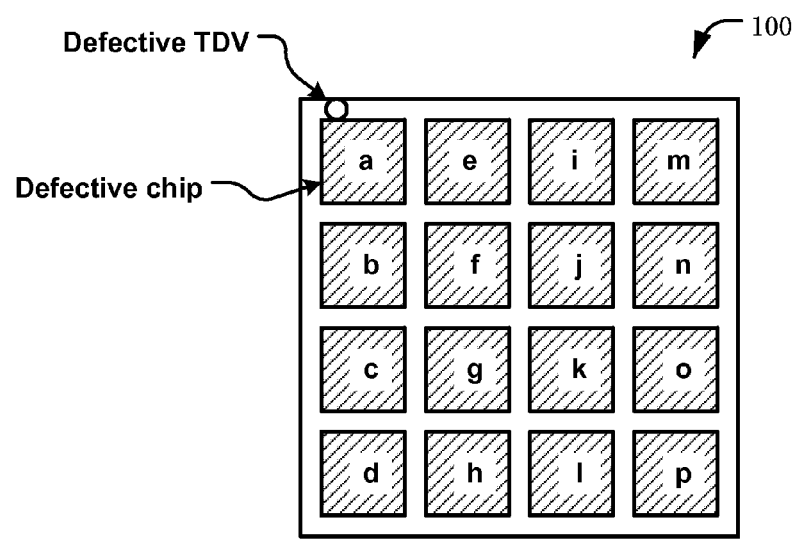
FIG. 12 illustrates a defective through-silicon via and a defective chip in the package with multiple chip stacks illustrated in FIG. 6.

The controller chip 190 can also activate or deactivate a particular chip stack or a particular chip in a chip stack. For example, a redundancy and repair unit 1302 in the controller chip 190 can send an activation/deactivation control signal (via bus interface unit 1301) to the particular chip stack or particular chip. The redundancy and repair unit 1302 can also maintain and update an activity status of the particular chip stack in the multichip package in the chip stack status registers 1304. The controller chip 190 can deactivate a particular chip stack, for example, when the particular chip stack is no longer functioning. A chip stack may not function because of defective through-dielectric vias (vertical conductive lines), defective horizontal conductive lines, or a defective chip in the chip stack. FIG. 11 illustrates a defective through-dielectric via and defective chips in the single chip stack 400. As illustrated in FIG. 11, a single defective through-dielectric via or a single defective chip can render the entire chip stack 400 non-functioning. However, as illustrated in FIG. 12, with the multiple chip stacks of the three-dimensional multichip package 100, the controller chip can deactivate a chip stack with a defective through-dielectric via or defective chip permanently (e.g., chip stack "a"), while the entire multichip package 100 still can function with the rest of chip stacks (e.g., chip stacks "b", "c", . . . , "p").

With the multiple chip stacks, the three-dimensional multichip package 100 can provide built-in redundancy or "self-repair" capability. For example, with 16 processor cores (one processor core in each of the 16 chip stacks), the three-dimensional multichip package 100 can function with 14 processor cores. The controller chip 190 can be configured to distribute workloads dynamically to 14 of the 16 stacks that include processor cores, leaving two spare or redundant stacks. For example, the redundancy and repair unit can assign workload to chip stacks "a"-"n" (as illustrated in FIG. 12) by directing workload to the chip stacks "a"-"n" and updating the chip stack status registers 1304 accordingly. If one or two of the processor cores (or one or two of the chip stacks) become non-functioning, the controller chip 190 replaces it or them with the spare stacks (e.g., chip stacks "o" or "p" illustrated in FIG. 12). The three-dimensional multichip package 100 can also "downgrade" its performance if there are non-functional processor cores (or chip stacks). For example, the three-dimensional multichip package 100 can function with 10 processor cores if there are only 10 functioning chip stacks left in the three-dimensional multichip package 100.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An apparatus comprising:
a multichip package including a plurality of chip stacks including chips in a plurality of chip layers, each of the chip stacks including:
two or more chips, each chip being inside vertical projection of at least another chip in the chip stack, each chip being disposed in a respective one of the chip layers;
one or more horizontal conductive lines extending into perimeter regions around the chip stacks, the chips in a particular chip layer being electrically connected to horizontal conductive lines disposed in the particular chip layer;
one or more vertical conductive lines in the perimeter regions electrically connected to one or more of the horizontal conductive lines in at least two chip layers; and
a controller electrically connected to at least one chip in the plurality of chip stacks, the controller including circuits configured to deactivate one or more of the chip stacks.

2. The apparatus of claim 1, wherein the controller comprises a chip disposed above chips in a top chip layer.

3. The apparatus of claim 1, wherein the controller comprises a chip disposed in a top chip layer.

4. The apparatus of claim 1, wherein each of the chip stacks comprises a logic chip and a memory chip.

5. The apparatus of claim 1, wherein the controller includes circuits configured to adjust an operating frequency of one or more of the chip stacks.

6. The apparatus of claim 1, wherein chips in each of the chip stacks are flip mounted in their respective chip layers.

7. The apparatus of claim 1, wherein a number of chip stacks in the plurality of chip stacks is between 4 and 400.

8. The apparatus of claim 1, wherein a size of a chip in the plurality of chip stacks is between 1 and 10 millimeters in at least one of width and length of the chip.

9. The apparatus of claim 1, wherein the plurality of chip stacks includes multiple instances of a particular type of chip stack.

10. The apparatus of claim 1, wherein the controller includes registers indicating a status of chip stacks in the plurality of chip stacks.

11. The apparatus of claim 1, wherein the controller includes a redundancy and repair unit which can deactivate and activate selected chip stacks in the plurality of chip stacks.

12. The apparatus of claim 1, wherein the controller includes a redundancy and repair unit which can deactivate and activate selected chips in the plurality of chip stacks.

13. An apparatus comprising:
a multichip package including a plurality of chip stacks including chips in a plurality of chip layers, each of the chip stacks including:
two or more chips, each chip being inside vertical projection of at least another chip in the chip stack, each chip being disposed in a respective one of the chip layers;
one or more horizontal conductive lines extending into perimeter regions around the chip stacks, the chips in a particular chip layer being electrically connected to horizontal conductive lines disposed in the particular chip layer;
one or more vertical conductive lines in the perimeter regions electrically connected to one or more of the horizontal conductive lines in at least two chip layers; and
a controller electrically connected to at least one chip in the plurality of chip stacks, wherein each of the chip stacks comprises a logic chip, a volatile memory chip, and a non-volatile memory chip.

14. The apparatus of claim 13, wherein the controller includes circuits configured to deactivate one or more of the chip stacks.

15. A method for fabricating a three-dimensional multichip package, the method comprising:
forming a plurality of chip stacks including chips in a plurality of chip layers, including for each of the chip stacks:
providing two or more chips, each chip being inside vertical projection of at least another chip in the chip stack, each chip being disposed in a respective one of the chip layers;
one or more horizontal conductive lines extending into perimeter regions around the chip stacks, the chips in a particular chip layer being electrically connected to horizontal conductive lines disposed in the particular chip layer;
forming one or more vertical conductive lines in the perimeter regions electrically connected to one or more of the horizontal conductive lines in at least two chip layers; and
providing a controller electrically connected to at least one chip in the plurality of chip stacks, the controller including circuits configured to deactivate one or more of the chip stacks.

16. The method of claim 15, wherein the controller comprises a chip disposed above chips in a top chip layer.

17. The method of claim 15, wherein the controller comprises a chip disposed in a top chip layer.

18. The method of claim 15, wherein each of the chip stacks comprises a logic chip and a memory chip.

19. The method of claim 15, wherein each of the chip stacks comprises a logic chip, a volatile memory chip, and a non-volatile memory chip.

20. The method of claim 15, wherein the controller includes circuits configured to adjust an operating frequency of one or more of the chip stacks.

* * * * *